(12) United States Patent
Kim

(10) Patent No.: US 7,586,348 B2
(45) Date of Patent: Sep. 8, 2009

(54) SYSTEMS, APPARATUSES AND METHODS FOR SYNCHRONIZING CLOCK SIGNALS

(75) Inventor: Kyoung-Park Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 190 days.

(21) Appl. No.: 11/365,691

(22) Filed: Mar. 2, 2006

(65) Prior Publication Data
US 2006/0273827 A1 Dec. 7, 2006

(30) Foreign Application Priority Data
Jun. 2, 2005 (KR) .................. 10-2005-0047106

(51) Int. Cl.
*H03L 7/00* (2006.01)
(52) U.S. Cl. .......................... 327/163; 327/3
(58) Field of Classification Search ............... None
See application file for complete search history.

(56) References Cited

U.S. PATENT DOCUMENTS

| | | | | |
|---|---|---|---|---|
| 6,052,007 A * | 4/2000 | Ono | | 327/158 |
| 6,259,295 B1 * | 7/2001 | Kriz et al. | | 327/296 |
| 6,459,314 B2 * | 10/2002 | Kim | | 327/161 |
| 6,737,896 B2 * | 5/2004 | Yoshioka | | 327/144 |
| 6,741,109 B1 * | 5/2004 | Huang et al. | | 327/156 |
| 6,845,462 B2 * | 1/2005 | Yatsuda et al. | | 713/501 |
| 6,998,889 B2 * | 2/2006 | Best | | 327/157 |
| 7,024,324 B2 * | 4/2006 | Rifani et al. | | 702/79 |
| 7,071,746 B2 * | 7/2006 | Suda et al. | | 327/156 |
| 7,129,760 B2 * | 10/2006 | Millar | | 327/158 |
| 7,149,145 B2 * | 12/2006 | Kim et al. | | 365/189.14 |
| 2003/0117190 A1 * | 6/2003 | Ito | | 327/156 |

FOREIGN PATENT DOCUMENTS

| | | |
|---|---|---|
| JP | 2002-050945 | 2/2002 |
| JP | 2003-037494 | 2/2003 |
| JP | 2004-104754 | 4/2004 |
| KR | 1020020086358 A | 11/2002 |

\* cited by examiner

*Primary Examiner*—Cassandra Cox
(74) *Attorney, Agent, or Firm*—Harness, Dickey & Pierce, PLC

(57) ABSTRACT

An apparatus may include a first phase control circuit and/or a second phase control circuit. The first phase control circuit may compare the phase of the first clock signal with the phase of the second clock signal, and may control the phase of the first clock signal based on the result of the comparison. The second phase control circuit may control the phase of the second clock signal based on the result of the comparison output from the first phase control circuit. The first phase control circuit may control the phase of the first clock signal and/or the second phase control circuit may control the phase of the second clock signal such that they are synchronized with each other.

15 Claims, 9 Drawing Sheets

SYSTEMS, APPARATUSES AND METHODS FOR SYNCHRONIZING CLOCK SIGNALS

PRIORITY STATEMENT

This non-provisional application claims priority under 35 U.S.C. § 119 to Korean Patent Application No. 10-2005-0047106 filed on Jun. 2, 2005 in the Korean Intellectual Property Office (KIPO), the entire contents of which are incorporated herein by reference.

BACKGROUND

1. Field of the Invention

Example embodiments of the present invention relate to systems, apparatuses and methods for synchronizing clock signals, for example, semiconductor devices for synchronizing clock signals in a digital system, and methods for the same.

2. Description of the Related Art

In related art digital systems using a serial interface, a strobe clock signal may be synchronized with a data clock signal. A phase lock loop (PLL) or an inverter delay may be used as an apparatus for synchronizing the strobe clock signal with the data clock signal. To synchronize the strobe clock signal with the data clock signal, at least one of the strobe clock signal and the data clock signal may be delayed for a given time (hereinafter, referred to as the "delay").

The PLL may control the delay; however, it may also consume more power than the inverter delay. The inverter delay may consume less power than the PLL, however, the inverter delay may not control the delay as accurately. In addition, the delay by the inverter delay may vary depending on the change in process, temperature and/or voltage.

Power consumption may be important in mobile communications terminals such as mobile phones, personal digital assistants (PDAs) or any other handheld consumer electronic device.

SUMMARY OF THE INVENTION

Example embodiments of the present invention provide apparatuses and methods for synchronizing a strobe clock signal with a data clock signal, which may more accurately adjust the delay and/or utilize less power.

In an example embodiment of the present invention, a first phase control circuit may compare a phase of a first clock signal with a phase of a second clock signal, and control the phase of the first clock signal based on a result of the comparison. A second phase control circuit may control the phase of the second clock signal based on the result of the comparison. The first phase control circuit may control the phase of the first clock signal and the second phase control circuit may control the phase of the second clock signal such that the phase of the first clock signal and the phase of the second clock signal may be synchronized with each other.

In another example embodiment of the present invention, a first phase control circuit may compare a first phase of a first clock signal with a second phase of a second clock signal, and control the first phase of the first clock signal based on a result of the comparison such that the first phase of the first clock signal and the second phase of the second clock signal are synchronized with each other. A first clock signal having a third phase may be output. A second phase control circuit may received a second clock signal having a fourth phase, and control the fourth phase of the second clock signal based on the result of the comparison output from the first phase control circuit such that the first phase of the first clock signal and the second phase of the second clock signal may be synchronized with each other. The second clock signal having the second phase may be output.

In another example embodiment of the present invention, a first phase control circuit may sample a second clock signal based on a first clock signal, and control the phase of the first clock signal based on a result of the sampling. A second phase control circuit may control the phase of the second clock signal based on the second clock signal and the result of the sampling output from the first phase control circuit. The first phase control circuit may control the phase of the first clock signal and the second phase control circuit may control the phase of the second clock signal until the phase of the first clock signal and the phase of the second clock signal may be synchronized with each other.

In another example embodiment of the present invention, a first clock signal may be sampled in response to a second clock signal. At least one of the phase of the first clock signal and the phase of the second clock signal may be controlled based on a result of the sampling such the phase of the first clock signal and the phase of the second clock signal may be synchronized with each other.

In another example embodiment of the present invention, the phase of a first clock signal may be compared with the phase of a second clock signal. At least one of the phase of the first clock signal and the phase of the second clock signal may be controlled based on a result of the comparison such the phase of the first clock signal and the phase of the second clock signal may be synchronized with each other.

In example embodiments of the present invention, the first phase control circuit may include a first clock signal generation circuit, a first selection circuit, a phase comparison circuit and/or a selection signal circuit. The first clock signal generation circuit may generate a plurality of clock signals having different phases based on a received first input clock signal. The first selection circuit may receive the plurality of clock signals output from the first clock signal generation circuit, and may output one of the received clock signals as the first clock signal based on a selection signal corresponding to the result of the comparison. The phase comparison circuit may receive the first and second clock signals and compare the phase of the first clock signal and the phase of the second clock signal. The selection signal generation circuit may generate the selection signal to synchronize the phase of the first clock signal and the phase of the second clock signal based on an output signal of the phase comparison circuit.

In example embodiments of the present invention, the first phase control circuit may include includes, a first clock signal generation circuit, a first selection circuit, a sampling circuit and/or a selection signal generation circuit. The first clock signal generation circuit may generate a plurality of clock signals having different phases based on a received first input clock signal. The first selection circuit may receive the plurality of clock signals output from the first clock signal generation circuit, and may output one of the received clock signals as the first clock signal based on a selection signal corresponding to the result of the comparison. The sampling circuit may receive the first and second clock signals and may sample the first clock signal based on the second clock signal. The selection signal generation circuit may generate the selection signal based on an output signal from the sampling circuit.

In example embodiments of the present invention, second phase control circuit may include a second clock signal generation circuit and/or a second selection circuit. The second clock signal generation circuit may generate a plurality of clock signals having different phases based on a received second input clock signal. The second selection circuit may receive the plurality of clock signals output from the second clock signal generation circuit and may output one of the received clock signals as the second clock signal based on the selection signal.

In example embodiments of the present invention, the second phase control circuit may include a second clock signal generation circuit and/or a second selection circuit. The second clock signal generation circuit may generate a plurality of clock signals having different phases based on a received second input clock signal. The second selection circuit may receive the plurality of clock signals output from the second clock signal generation circuit and may output one of the received clock signals as the second clock signal based on a selection signal corresponding to the result of comparison.

In example embodiments of the present invention, the first phase control circuit may include a first clock signal generation circuit, a first selection circuit, a phase comparison circuit, a sampling circuit, a storage circuit and/or a selection signal generation circuit. The first clock signal generation circuit may generate a plurality of clock signals having different phases based on a received first input clock signal. The first selection circuit may receive the clock signals output from the first clock signal generation circuit and may output one of the received clock signals as the first clock signal based on a selection signal corresponding to the result of comparison. The phase comparison circuit may receive the first and second clock signals and compare the phase of the first clock signal and the phase of the second clock signal. Alternatively, a sampling circuit may receive the first and second clock signals and may sample the first clock signal based on the second clock signal. The storage circuit for storing an output signal of the phase comparison circuit or sampling circuit in response to the second clock signal. The selection signal generation circuit may output the selection signal based on an output signal output from the storage circuit.

In example embodiments of the present invention, the storage circuit may include a counter, a plurality of storage circuits, a first logic circuit and/or a second logic circuit. The counter may output a count value in response to the second clock signal. The plurality of unit storage circuits may each store the output signal of the phase comparison circuit in response to the second clock signal and a corresponding count value output from the counter. The first logic circuit may perform a first logic operation on signals received from the unit storage circuits and may output the result of first logic operations. The second logic circuit may perform a second logic operation on signals received from the unit storage circuits and may output the result of the logic operations.

In example embodiments of the present invention, the first clock signal may be one of a data clock signal and a strobe clock signal and the second clock signal may be the other of the data clock signal and the strobe clock signal.

In example embodiments of the present invention, the second phase and the third phase may be the same or different.

BRIEF DESCRIPTION OF THE DRAWINGS

Example embodiments of the present invention will become more apparent by describing in detail the example embodiments of the present invention illustrated in the attached drawings in which.

DETAILED DESCRIPTION OF EXAMPLE EMBODIMENTS OF THE PRESENT INVENTION

Figure 1:
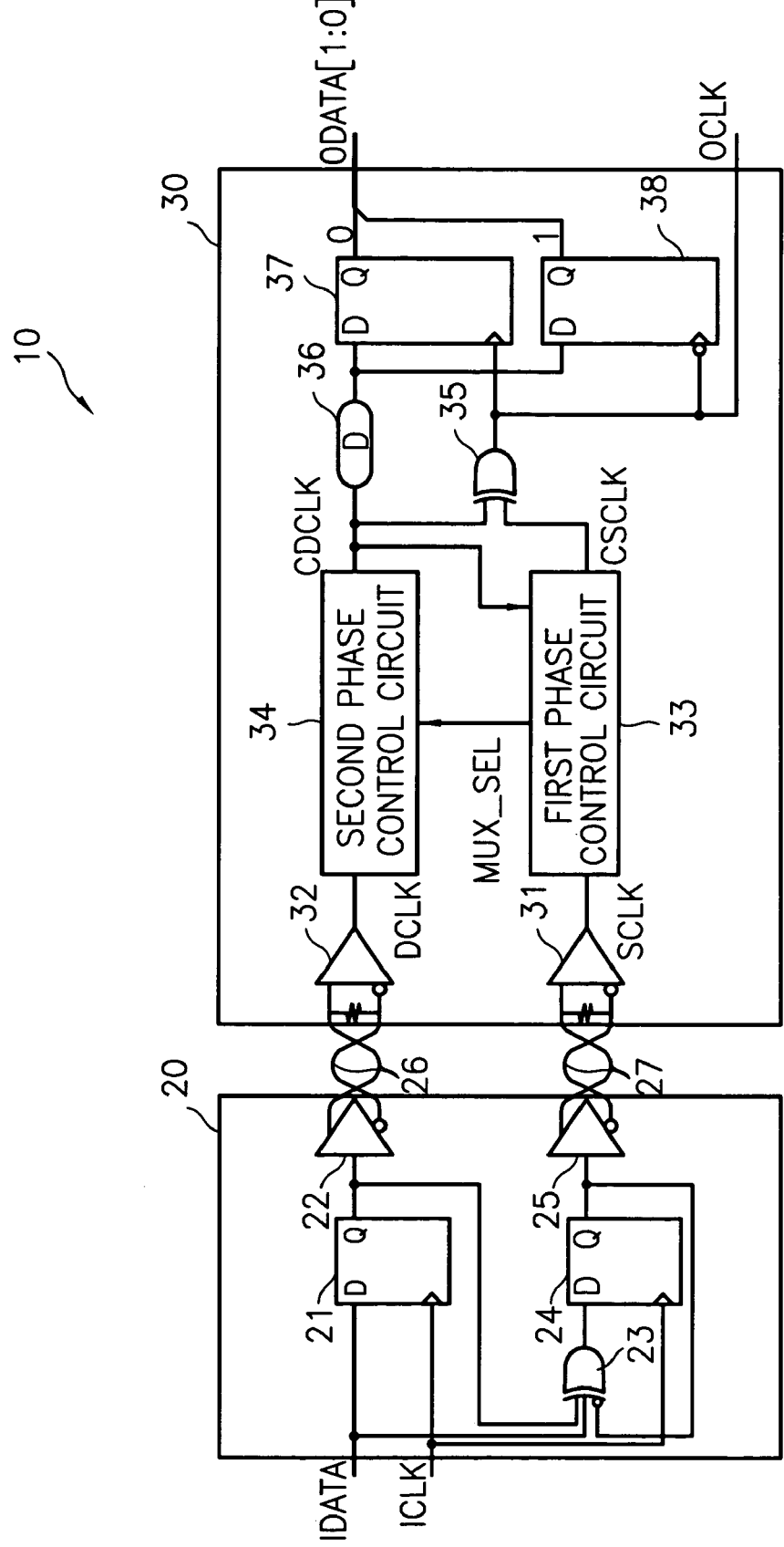
FIG. 1 is a block diagram of a digital system according to an example embodiment of the present invention.

Detailed, illustrative, example embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 illustrates a digital system according to an example embodiment of the present invention, such as, a mobile terminal, cellular telephone, PDA, or any other suitable handheld electronic device. As shown, a digital system 10 may include a transmitter or signal transmitting apparatus 20 and/or a receiver or signal receiving apparatus 30. The transmitter 20 and the receiver 30 may exchange data, for example, in series or in parallel via flexible cables 26 and 27. For example, in mobile communications terminals, such as, mobiles phones and PDAs, the transmitter 20 may include a key pad, and/or the receiver 30 may include a display device such as an liquid crystal display (LCD), organic light emitting diode (OLED), or any other suitable display device.

The transmitter 20 may include a first transmission latch 21, a first transmission differential amplifier 22, a logic circuit 23, a second transmission latch 24 and/or a second transmission differential amplifier 25. The first transmission latch 21 may latch input data IDATA in response to an input clock signal ICLK. The first transmission differential amplifier 22 may generate differential signals in response to the output signal of the first transmission latch 21.

The logic circuit 23 may perform a logic operation on the output signal of the first transmission latch 21, the input data IDATA and/or an inverse of the output signal from the second transmission latch 24, and may output the result of operation to an input terminal of the second transmission latch 24. The logic circuit 23 may be, for example, an exclusive-OR (EX-OR) circuit or any other suitable logic circuit.

The second transmission latch 24 may latch the output signal of the logic circuit 23, for example, in response to the input clock signal ICLK. The second transmission differential amplifier 25 may generate differential strobe clock signals in response to the output signal of the second transmission latch 24. The differential strobe clock signals may be transmitted to a first differential amplifier 31 of the receiver 30 via flexible cable 27.

In a clock calibration phase for synchronizing a strobe clock signal with a data clock signal, since the input data IDATA is the data clock signal, the transmitter 20 may transmit differential data clock signals to a second differential amplifier 32 of the receiver 30 via flexible cable 26. After the clock calibration phase is completed, in a data transmission phase, the input data IDATA may be normal input data and the transmitter 20 may transmit differential input data to a second differential amplifier 32 of the receiver 30 via flexible cable 26.

The receiver 30 may include the first differential amplifier 31, the second differential amplifier 32, a first phase control circuit 33, a second phase control circuit 34, a logic circuit 35, a delay circuit 36, a first latch 37 and/or a second latch 38. In example operation of the receiver 30, in a clock calibration phase, the first differential amplifier 31 may receive the differential strobe clock signals via flexible cable 27 and may amplify the received signals to output a strobe clock signal SCLK. The differential strobe clock signals may be input to the first differential amplifier 31 in series or in parallel. The second differential amplifier 32 may receive the differential data clock signals via flexible cable 26 and may amplify the received signals to output a data clock signal DCLK. The differential data clock signals may be input to the second differential amplifier 32 in series or in parallel.

The first phase control circuit 33 may receive a first clock signal (e.g., a strobe clock signal) SCLK having a first phase and a second clock signal (e.g., a data clock signal) CDCLK having a second phase. The first phase control circuit 33 may compare the first phase of the first clock signal SCLK with the second phase of the second clock signal CDCLK. In response to a selection signal MUX_SEL corresponding to the result of comparison, the first phase control circuit 33 may control the first phase of the first clock signal SCLK such that the first phase of the first clock signal SCLK and the second phase of the second clock signal CDCLK may be synchronized with each other. The first phase control circuit 33 may output a first clock signal having a third phase CSCLK.

In response to the selection signal MUX_SEL output from the first phase control circuit 33, the second phase control circuit 34 may control a fourth phase of a second clock signal DCLK such that the first phase of the first clock signal SCLK and the second phase of the second clock signal CDCLK may be synchronized with each other. The second phase control circuit 34 may output the second clock signal CDCLK having the second phase.

Figure 2:
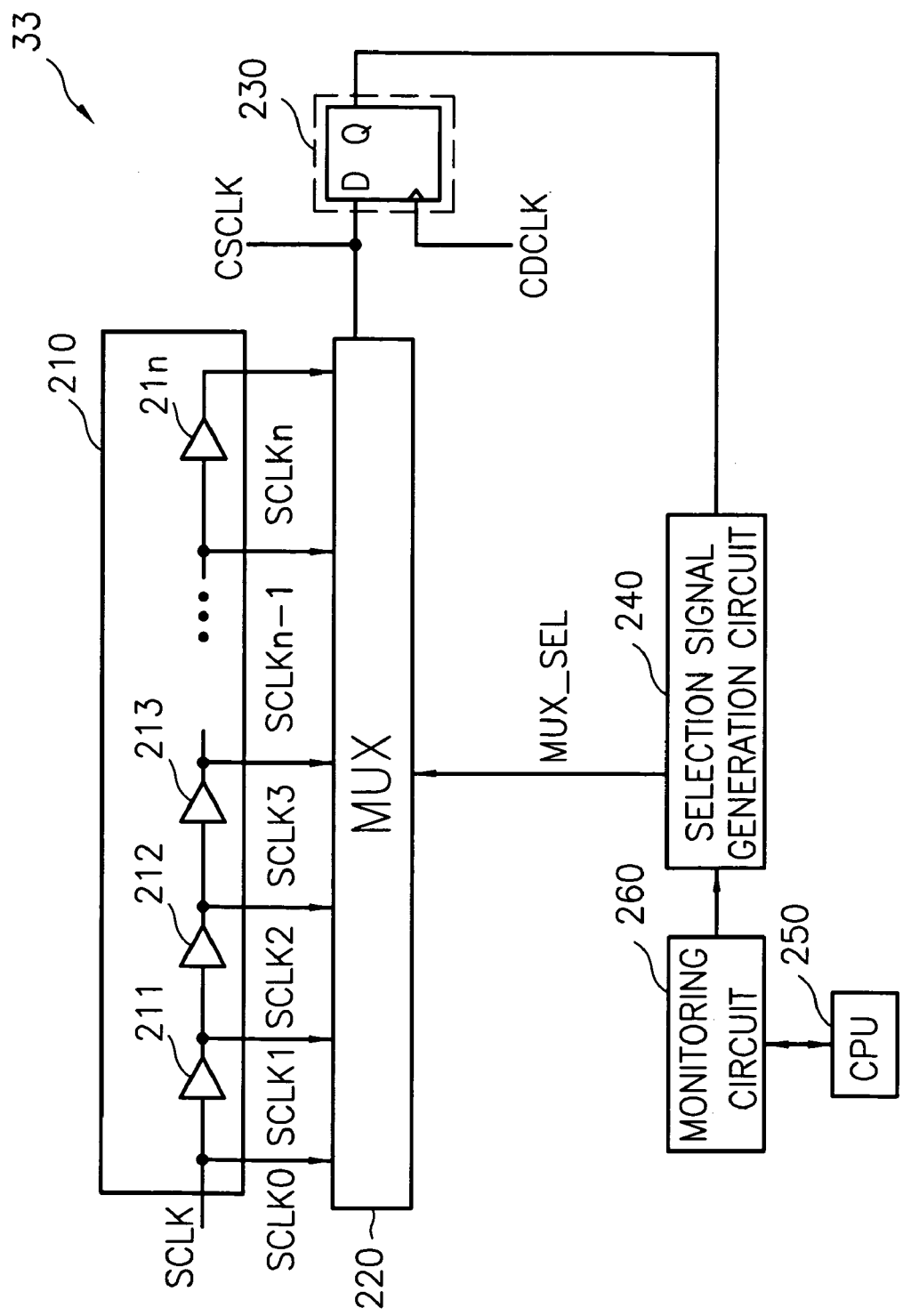
FIG. 2 is a block diagram of a phase control circuit according to an example embodiment of the present invention.

FIG. 2 is a block diagram of a phase control circuit according to an example embodiment of the present invention. Referring to FIG. 2, the first phase control circuit 33 may include a first clock signal generation circuit 210, a first selection circuit 220, a phase comparison circuit 230, a selection signal generation circuit 240, a CPU 250 and/or a monitoring circuit 260.

The first clock signal generation circuit 210 may include a plurality of buffers 211, 212, 213, . . . , and 21$n$, where "n" is a natural number. In FIG. 2, the plurality of buffers 211, 212, 213, . . . , and 21$n$ are shown as connected in series; however, the plurality of buffers 211, 212, 213, . . . , and 21$n$ may be connected in parallel. The first clock signal generation circuit 210 may receive a first input clock signal, (e.g., the first clock signal SCLK having the first phase), and may generate a plurality of clock signals SCLK0, SCLK1, SCLK2, . . . , and SCLKn having different phases based on the received first input clock signal SCLK. In example embodiments of the present invention, clock signal SCLK0 may be first input clock signal SCLK.

The first selection circuit 220 may receive the clock signals SCLK0, SCLK1, SCLK2, . . . , and SCLKn having different phases and may select one of the clock signals SCLK0, SCLK1, SCLK2, . . . , and SCLKn having different phases, as the first clock signal CSCLK having a third phase, for example, in response to a selection signal MUX_SEL output from the selection signal generation circuit 240. The first selection circuit 220 may be, for example, a multiplexer.

Figure 4:
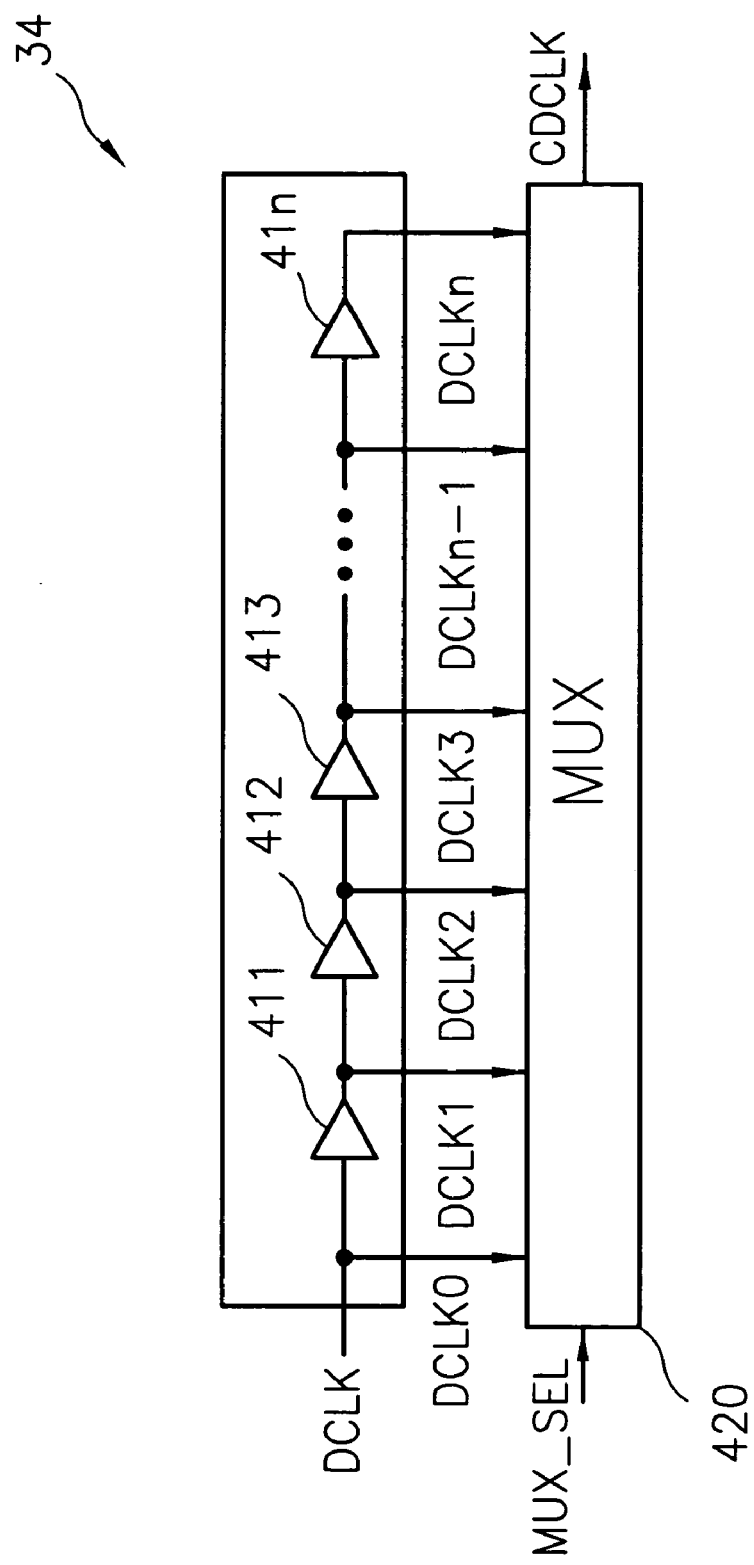
FIG. 4 is a block diagram of a phase control circuit according to another example embodiment of the present invention.

The phase comparison circuit 230 may receive the first clock signal CSCLK output from the first selection circuit 220 and the second clock signal CDCLK output from a second selection circuit 420 shown in FIG. 4. The phase comparison circuit 230 may compare the phase of the first clock signal CSCLK with the phase of the second clock signal CDCLK, and may output the result of comparison to the selection signal generation circuit 240.

The selection signal generation circuit 240 may output the selection signal MUX_SEL to each of the first selection circuit 220 and the second selection circuit 420 of FIG. 4 based on the output signal of the phase comparison circuit 230. The selection signal MUX_SEL may function as a control signal to synchronize the phase of the first clock signal CSCLK with the phase of the second clock signal CDCLK.

The CPU 250 may output a control signal to control the clock calibration phase and/or the data transmission phase to the monitoring circuit 260. The monitoring circuit 260 may control the operation of the selection signal generation circuit 240 in response to the control signal output from the CPU 250.

The monitoring circuit 260 may output an enable signal EN to the selection signal generation circuit 240 in response to the control signal to control the clock calibration phase. In response to the enable signal EN, the selection signal generation circuit 240 may output the selection signal MUX_SEL to each of the first selection circuit 220 and the second selection circuit 420 of FIG. 4.

The monitoring circuit 260 may output a control signal to the selection signal generation circuit 240 to discontinue the operation of the selection signal generation circuit 240. The monitoring circuit 260 may output the control signal, for example, when the phase of the first clock signal CSCLK and the phase of the second clock signal CDCLK are synchronized with each other in the clock calibration phase. The monitoring circuit 260 may monitor the operation of the selection signal generation circuit 240.

Although example embodiments of the present invention are illustrated as including the phase comparison circuit 230, the phase comparison circuit 230 may be replaced by a sampling circuit. The sampling circuit may receive the first clock signal CSCLK and the second clock signal CDCLK, and may sample the first clock signal CSCLK based on the second clock signal CDCLK. The sampling circuit may output the result of sampling to the selection signal generation circuit 240. The sampling circuit may be, for example, a D flip-flop or any other suitable flip-flop. The selection signal generation circuit 240 may output the selection signal MUX_SEL corresponding to the result of sampling output from the sampling circuit to the first selection circuit 220.

Figure 3:
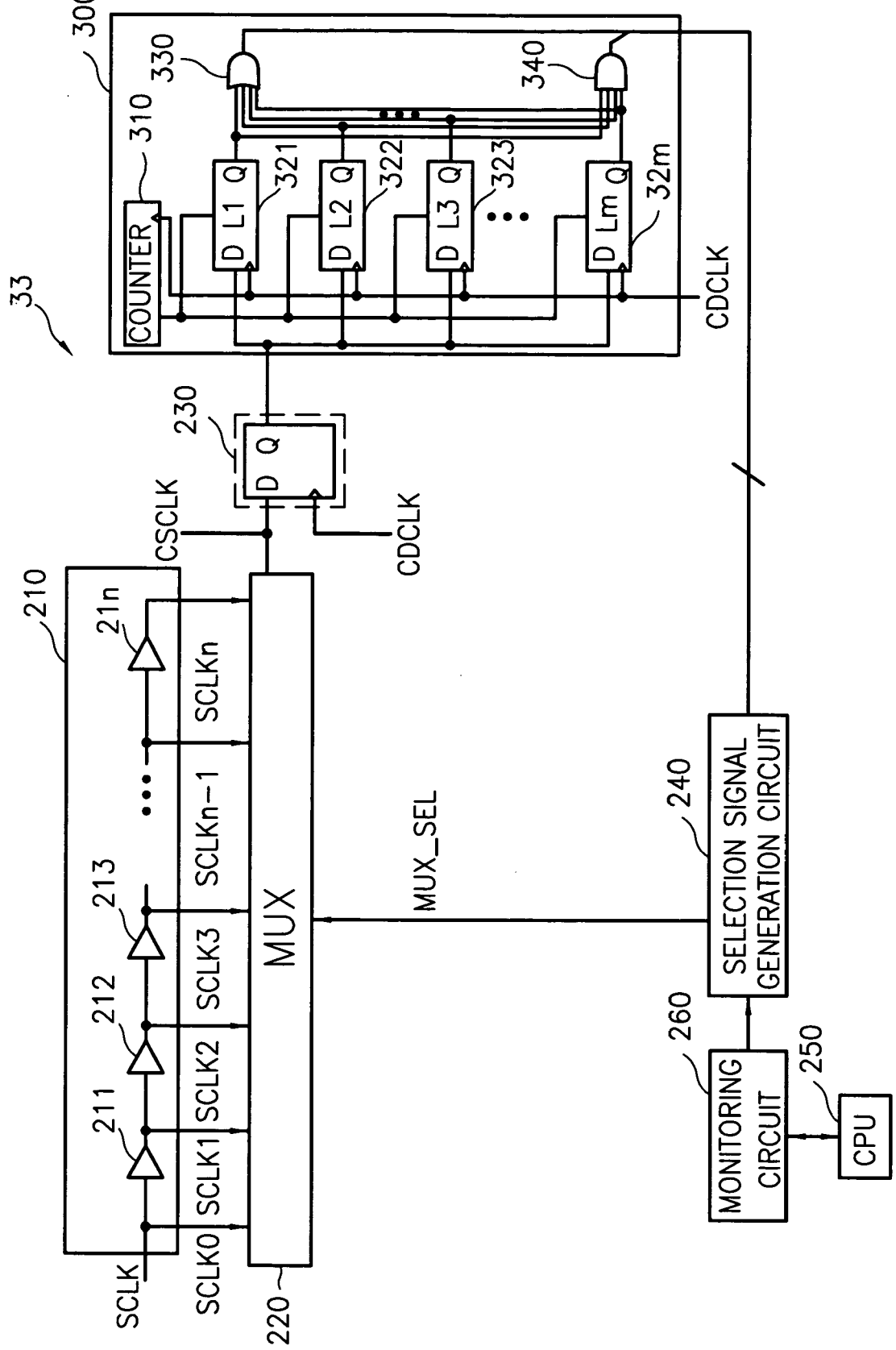
FIG. 3 is a block diagram of a phase control circuit according to another example embodiment of the present invention.

FIG. 3 is a block diagram of a phase control circuit according to another example embodiment of the present invention. Referring to FIGS. 2 and 3, a first phase control circuit 33 shown in FIG. 3 may include a storage circuit 300 for storing the result of comparison of the phase output from the phase comparison circuit 230, and/or or the result of sampling output from the sampling circuit. The storage circuit 300 may include a counter 310, a plurality of unit storage circuits 321, 322, 323, . . . , and 32*m*, where "m" is a natural number, an OR circuit 330, and/or an AND circuit 340. The counter 310 may output a count value, for example, an N bit, where "N" is a natural number, in response to the second clock signal CDCLK.

Each of the unit storage circuits 321, 322, 323, . . . , and 32*m* may be, for example, a latch (e.g., a D flip-flop or any other suitable latch circuit). Each of the unit storage circuits 321, 322, 323, . . . , and 32*m* may store the output signal of the phase comparison circuit or the sampling circuit 230 in response to the second clock signal CDCLK and a corresponding count value output from the counter 310.

The corresponding count value output from the counter 310 may be an enable signal for the corresponding unit storage circuits 321, 322, 323, . . . , and 32*m*. For example, when "m" is 8, the first D flip-flop 321 may store a sampling value sampled by the sampling circuit 230 at the first cycle Ti in response to the second clock signal CDCLK and the count value 000 output from the counter 310. The second D flip-flop 322 may store a sampling value sampled by the sampling circuit 230 at the second cycle T2 in response to the second clock signal CDCLK and the count value 001 output from the counter 310. The eighth D flip-flop 328 may store a sampling value sampled by the sampling circuit 230 at the eighth cycle T8 in response to the second clock signal CDCLK and the count value 111 output from the counter 310.

The OR circuit 330 may receive the output signal of each of the unit storage circuits 321, 322, 323, . . . , and 32*m*, may perform an OR logic operation on the received signals and may output the result of OR operation to the selection signal generation circuit 240.

The AND circuit 340 may receive the output signal of each of the unit storage circuits 321, 322, 323, . . . , and 32*m*, perform an AND operation on the received signals and may output the result of AND operation to the selection signal generation circuit 240.

The selection signal generation circuit 240 may be programmed to generate a selection signal MUX_SEL corresponding to the signal output, for example, 2-bit signals 00, 10, 01 and 11, from the OR circuit 330 and the AND circuit 340. For example, when the level of the output signal of the OR circuit 330 is 0 (e.g., logic low), and the level of the output signal of the AND circuit 340 is 1 (e.g., logic high), the selection signal generation circuit 240 may output the programmed selection signal MUX_SEL to the first selection circuit 220.

FIG. 4 is a block diagram of a phase control circuit according to another example embodiment of the present invention. As shown, a second phase control circuit 34 may include a second clock signal generation circuit 410 and/or the second selection circuit 420.

The second clock signal generation circuit 410 may include a plurality of buffers 411, 412, 413, . . . , 41*n*, where "n" is a natural number. The second clock signal generation circuit 410 may receive a second input clock signal, for example, the second clock signal DCLK having the fourth phase, and may generate a plurality of clock signals DCLK0, DCLK1, . . . , DCLKn, where "n" is a natural number, having different phases based on the received second input clock signal DCLK. In an example embodiment of the present invention, the received second input clock signal DCLK may be clock signal DCLK0.

The second selection circuit 420 may receive the clock signals DCLK0, DCLK1, . . . , DCLKn having different phases, and may select one of the clock signals DCLK0, DCLK1, . . . , DCLKn as the second clock signal having a second phase CDCLK. The second selection circuit 420 may select one of the clock signals DCLK0, DCLK1, . . . , DCLKn in response to the selection signal MUX_SEL output from the selection signal generation circuit 240.

Figure 5:
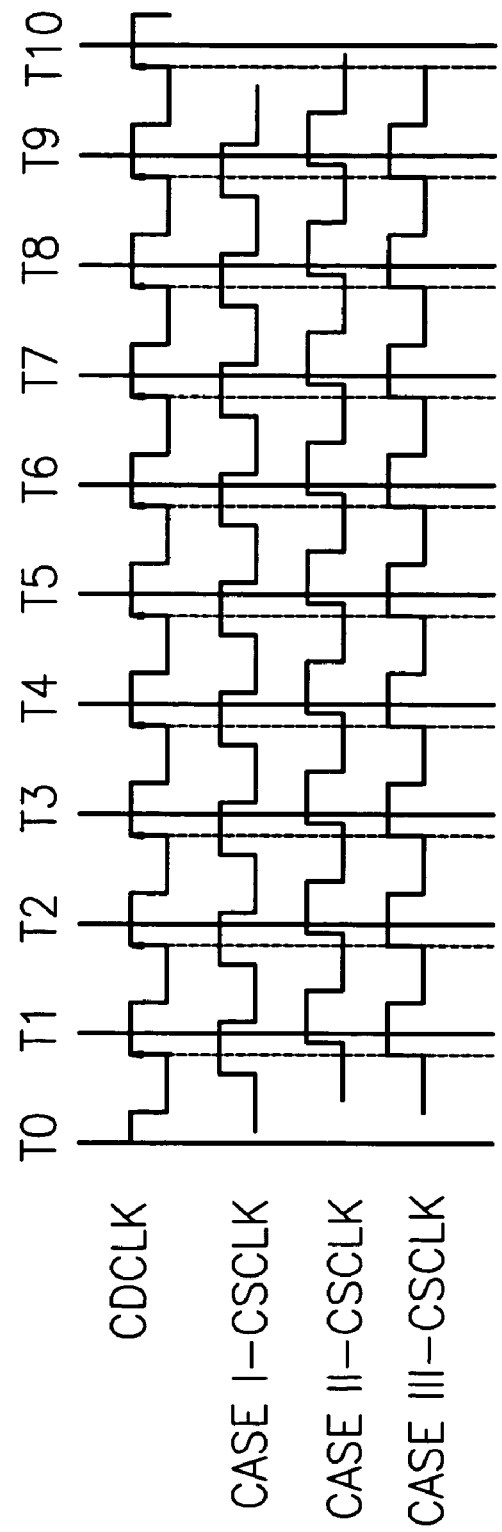
FIG. 5 is an example timing diagram for clock signals according to an example embodiment of the present invention.
Figure 6:
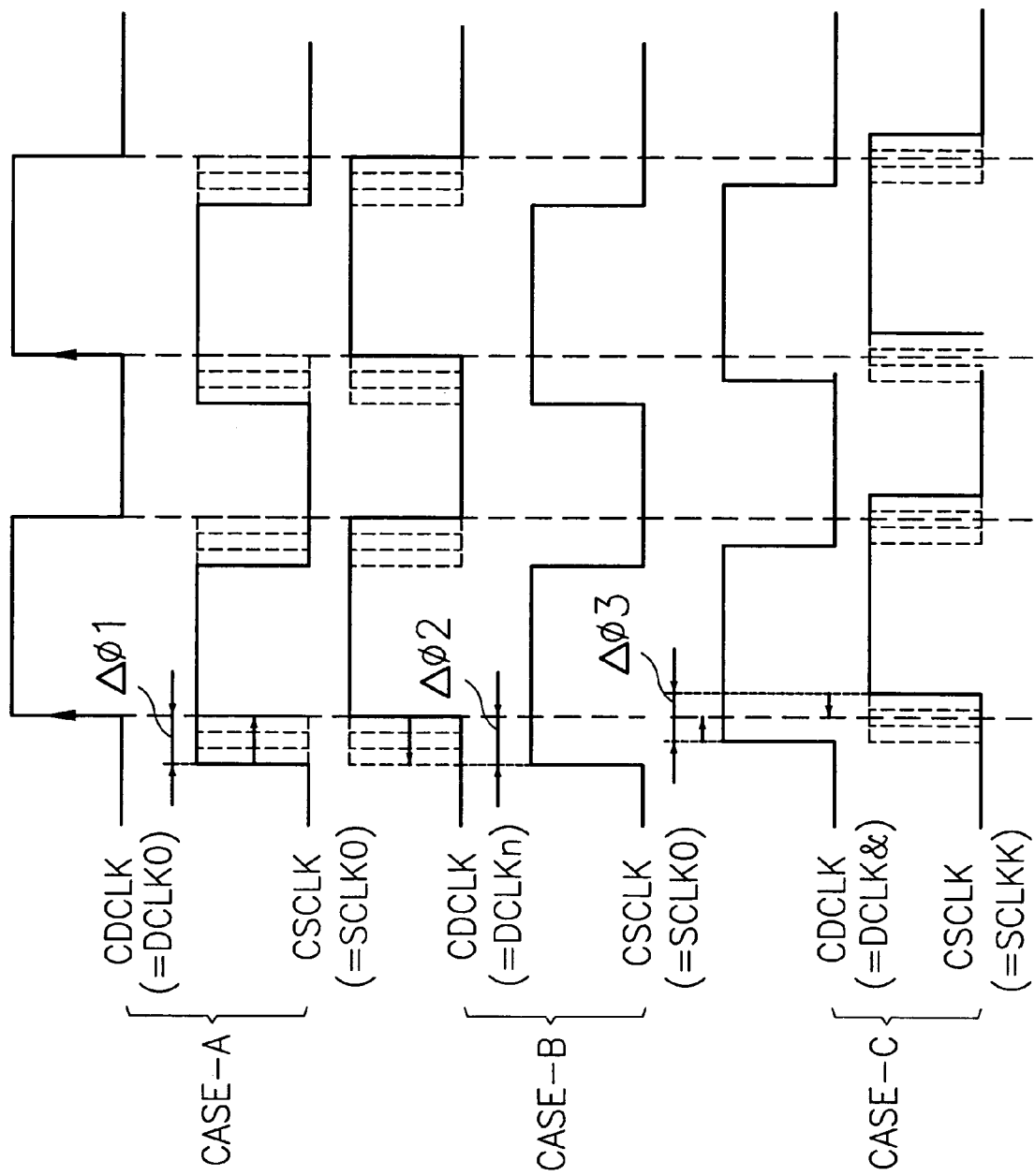
FIG. 6 illustrates a method for synchronizing clock signals according to an example embodiment of the present invention.
Figure 7:
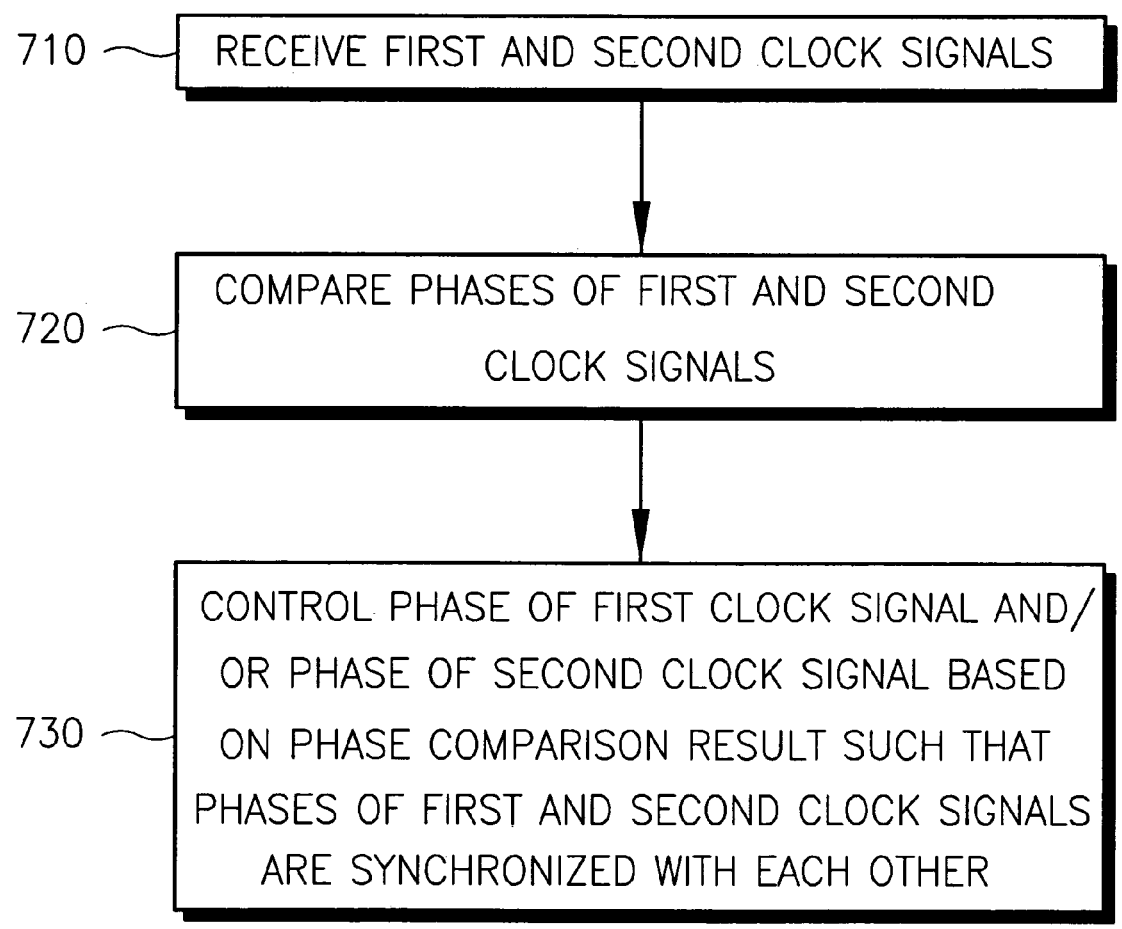
FIG. 7 is a flow chart illustrating a method for synchronizing clock signals according to an example embodiment of the present invention.
Figure 8:
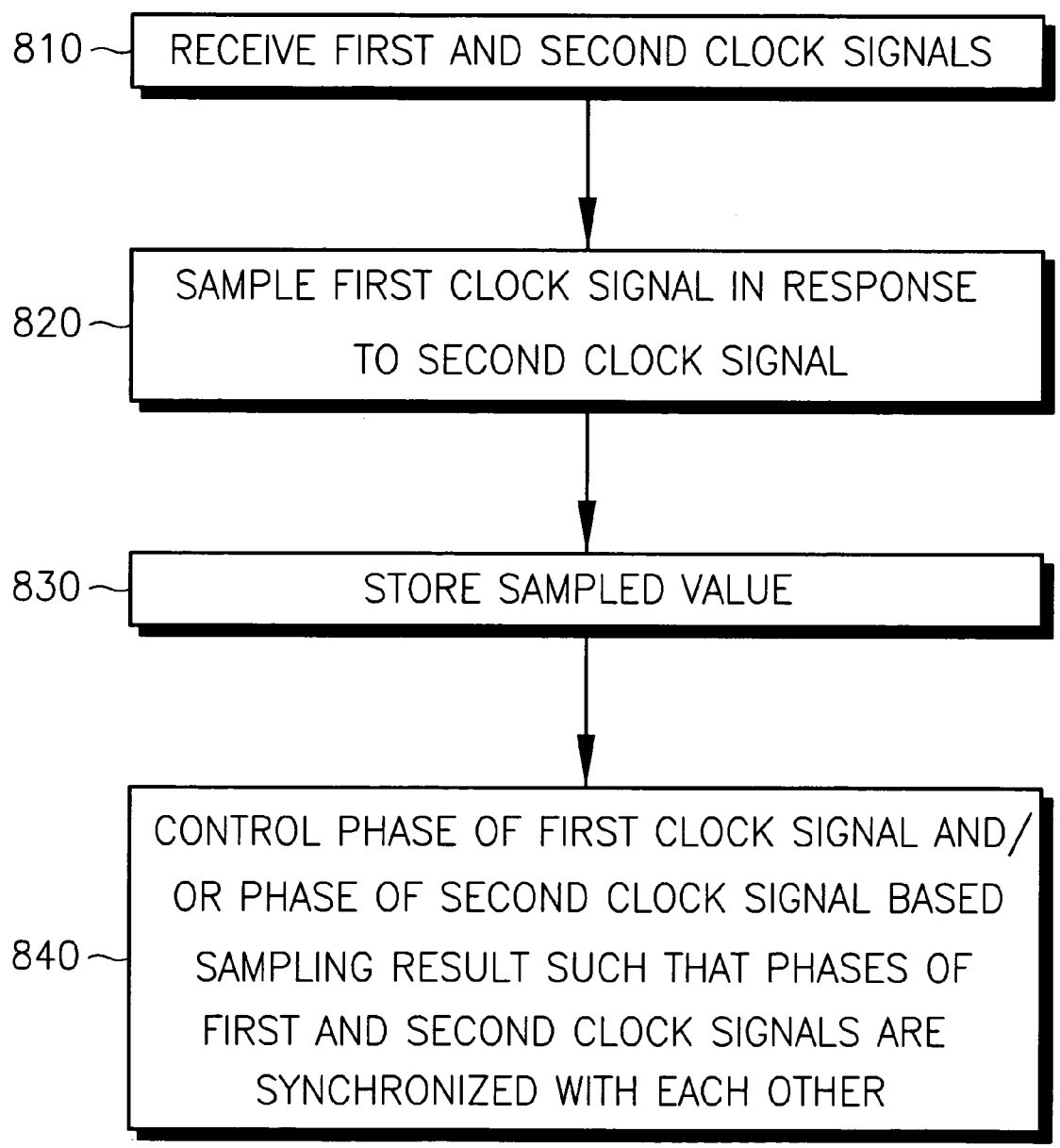
FIG. 8 is a flow chart illustrating a method for synchronizing clock signals according to another example embodiment of the present invention.

FIG. 5 is an example timing diagram for clock signals according to an example embodiment of the present invention. FIG. 6 is a view showing a method for synchronizing clock signals according to an example embodiment of the present invention. FIG. 7 is a flow chart illustrating a method for synchronizing clock signals according to an example embodiment of the present invention. A method of synchronizing clock signals according to example embodiments the present invention will be described below with reference to FIGS. 1 through 7.

In one example, the first phase control circuit 33 receives the first input clock signal SCLK and may output the clock signal SCLK as the first clock signal CSCLK, and that the second phase control circuit 34 receives the second input clock signal DCLK and may output the clock signal DCLK0 (e.g., DCLK) as the second clock signal CDCLK.

The phase comparison circuit 230 of the first phase control circuit 33 may receive the first clock signal CSCLK and the second clock signal CDCLK (at 710), and may compare the phase of the first clock signal CSCLK and the phase of the second clock signal CDCLK. At 720, the phase comparison circuit 230 may output the result of comparison.

Referring to Case-I of FIG. 5 and Case-A of FIG. 6, in a method of synchronizing the phase of the first clock signal CSCLK and the phase of the second clock signal CDCLK, according to an example embodiment of the present invention, if the phase of the first clock signal CSCLK leads the phase of the second clock signal CDCLK, the phase comparison circuit 230 may output a logic high or 1. The selection signal generation circuit 240 may output the selection signal MUX_SEL to the first selection circuit 220 in response to the output signal of the phase comparison circuit 230. The first selection circuit 220 may output the clock signal SCLK1 of the clock signals SCLK0, SCLK1, . . . , and SCLKn as the first clock signal CSCLK in response to the selection signal MUX_SEL. The phase of the clock signal SCLK1 may lag the phase of the clock signal SCLK0.

If the phase of the first clock signal CSCLK leads the phase of the second clock signal CDCLK, the phase comparison circuit 230 may maintain the logic high or 1. The selection signal generation circuit 240 may output the selection signal MUX_SEL to the first selection circuit 220 in response to the output signal of the phase comparison circuit 230. The first selection circuit 220 may output the clock signal SCLK2 of the clock signals SCLK0, SCLK1, . . . , and SCLKn as the first clock signal CSCLK in response to the selection signal MUX_SEL.

The first phase control circuit 33 may delay the phase of the first clock signal CSCLK, for example, until the phase of the first clock signal CSCLK and the phase of the second clock signal CDCLK are synchronized with each other. The second phase control circuit 34 may output the clock signal DCLK0 as the second clock signal CDCLK in response to the selection signal MUX_SEL.

In another example, the first phase control circuit 33 may receive the first input clock signal SCLK and may output the clock signal SCLK0 as the first clock signal CSCLK, and that the second phase control circuit 34 may receive the second input clock signal DCLK and may output the clock signal DCLKn as the second clock signal CDCLK.

Referring to Case-I of FIG. 5 and Case-B of FIG. 6, in a method of synchronizing the phase of the first clock signal CSCLK and the phase of the second clock signal CDCLK according to an example embodiment of the present invention, if the phase of the first clock signal CSCLK leads the phase of the second clock signal CDCLK, the selection signal generation circuit 240 may output the selection signal MUX_SEL to the first selection circuit 220 in response to the output signal of the phase comparison circuit 230. The first selection circuit 220 may output (e.g., continuously output) the clock signal SCLK0 of the clock signals SCLK0, SCLK1, . . . , and SCLKn as the first clock signal CSCLK in response to the selection signal MUX_SEL.

The second selection circuit 420 may output the clock signal DCLKn-1 of the clock signals DCLK0, DCLK1, . . . , and DCLKn as the second clock signal CDCLK in response to the selection signal MUX_SEL. Until the phase of the first clock signal CSCLK and the phase of the second clock signal CDCLK are synchronized with each other, the second selection circuit 420 may output the clock signals DCLKn-2 and DCLKn-3 of the clock signals DCLK0, DCLK1, . . . , and DCLKn as the second clock signal CDCLK in response to the selection signal MUX_SEL.

As described above, the second phase control circuit 34 may advance the phase of the second clock signal CDCLK until the phase of the second clock signal CDCLK and the phase of the first clock signal CSCLK are synchronized with each other.

In Case-A, Case-B, and Case-C of FIG. 6, each of the first and second phase control circuits 33 and 34 may control the phase of the first clock signal CSCLK and/or the phase of the second clock signal CDCLK in response to the selection signal MUX-SEL until the phase of the first clock signal CSCLK and the phase of the second clock signal CDCLK are synchronized with each other at 730.

If the phase of the first clock signal CSCLK lags the phase of the second clock signal CDCLK as in Case-II, the first phase control circuit 33 may select one of the clock signals SCLK0, SCLK1, . . . , and SCLKn as the first clock signal CSCLK, in response to the selection signal MUX_SEL corresponding to the result of comparison of the phase comparison circuit 230. This may advance the phase of the first clock signal CSCLK.

The second phase control 34 may select one of the clock signals DCLK0, DCLK1, . . . , and DCLKn as the second clock signal CDCLK, in response to the selection signal MUX_SEL output as the result of comparison of the phase comparison circuit 230. This may delay the phase of the second clock signal CDCLK.

When the phase of the first clock signal CSCLK and the phase of the second clock signal CDCLK are synchronized, or substantially synchronized, with each other as in Case-II, the phase comparison circuit (or sampling circuit) 230 may be in a meta-stable state.

Referring to FIGS. 3, 5, 6, and 8, in methods of synchronizing the phase of the first clock signal CSCLK and the phase of the second clock signal CDCLK according to example embodiments of the present invention, the first phase control circuit 33 may receive the first and second clock signals SCLK and CDCLK at 810. The sampling circuit of the first phase control circuit 33 may be clocked by the second clock signal CDCLK, and may sample the first clock signal SCLK at 820. The storage circuit 300 may store the sampled value by the sampling circuit 230 in response to the second clock signal CDCLK at 830.

The first selection circuit 220 of the first phase control circuit 33 may output one of the clock signals SCLK0, SCLK1, . . . , and SCLKn as the first clock signal CSCLK in response to the selection signal MUX_SEL output from the selection signal generation circuit 240. The second selection circuit 420 of the second phase control circuit 34 may output one of the clock signals DCLK0, DCLK1, . . . , and DCLKn as the second clock signal CDCLK in response to the selection signal MUX_SEL output from the selection signal generation circuit 240.

The first phase control circuit 33 and the second phase control circuit 34, in response to the selection signal MUX_SEL corresponding to the result of sampling, may control the phase of the first clock signal CSCLK and/or the second clock signal CDCLK until the phase of the first clock signal CSCLK and the second clock signal CDCLK are synchronized at 840. As a result, each of phase differences $\Delta\Phi1$, $\Delta\Phi2$ and $\Delta\Phi3$ may be decreased by the operation of the first phase control circuit 33 and/or the second phase control circuit 34.

Referring back to FIG. 1, the logic circuit 35 may receive the first clock signal CSCLK and the second clock signal CDCLK, may perform a logic operation on the received signals and may output the result of the logic operation. The delay circuit 36 may delay the data output from the second phase control circuit 34 so that the first latch 37 and the second latch 38 may latch data more accurately.

The first latch 37 may latch the data output from the delay circuit 36 in response to the rising edge of the output signal of the logic circuit 35. The second latch 38 may latch the data output from the delay circuit 36 in response to the falling edge of the output signal of the logic circuit 35. The data output from the first latch 37 and the second latch 38 may be output data ODATA. A clock signal OCLK output from the logic circuit 35 may be used as a clock signal of the receiver 30.

Figure 9:
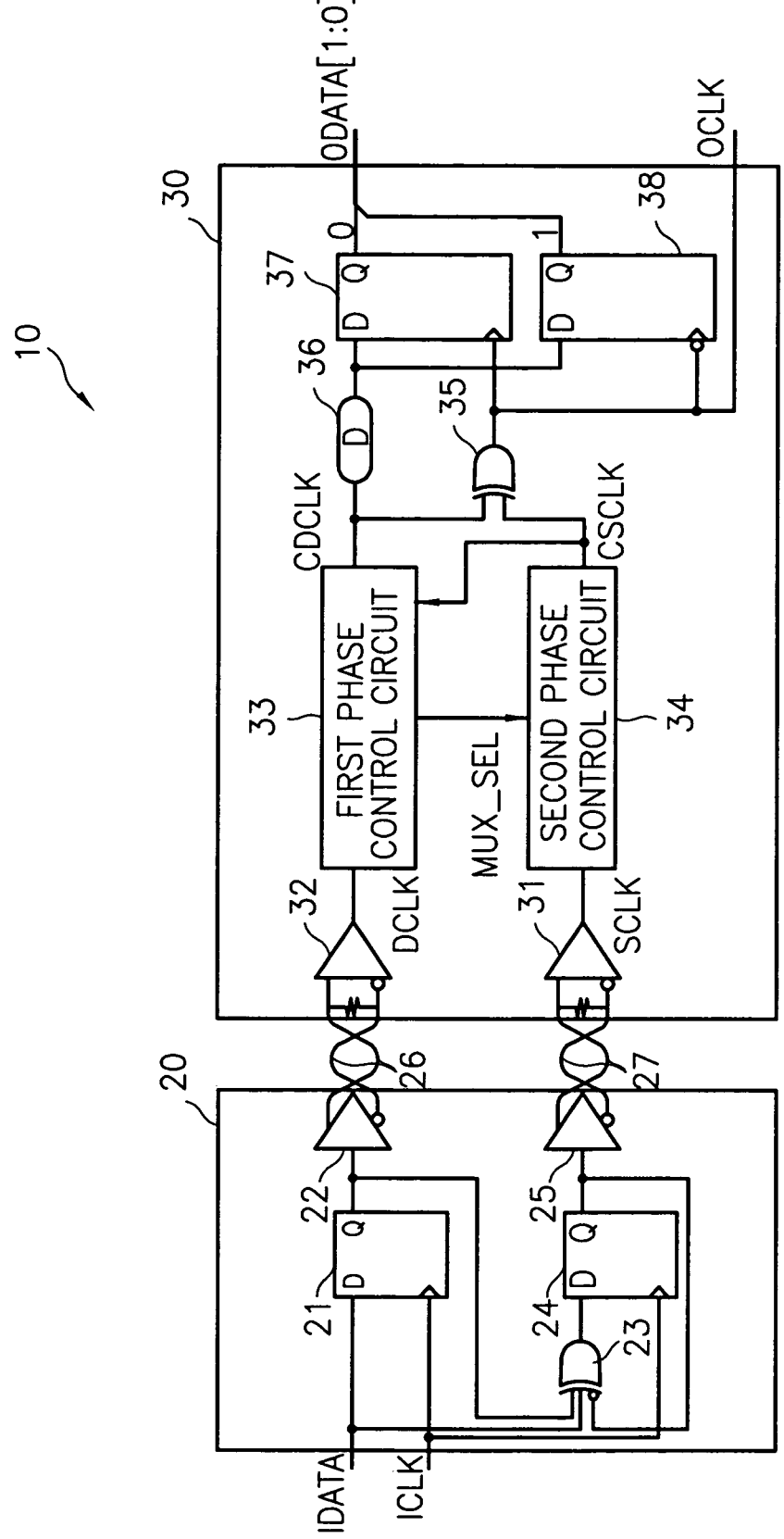
FIG. 9 is a block diagram illustrating a digital system according to another example embodiment of the present invention.

FIG. 9 is a block diagram of a digital system according to another example embodiment of the present invention. The example embodiment of the present invention as shown in FIG. 9 may be similar, or substantially similar to FIG. 1; however, the positions of the first and second phase control circuits 33 and 34 may be interchanged. Skilled artisans to which example embodiments of the present invention pertains will understand with reference to FIG. 9 that example embodiments of the present invention shown in FIGS. 2 through 8 may be applied to the digital system according to an example embodiment of the present invention as shown in FIG. 9.

Although example embodiments of the present invention have been described herein with reference to specific logic values (e.g., 1,0, high, low, etc.), it will be understood that any suitable logic value may be used interchangeably. In addition, or alternatively, although example embodiments of the present invention have been described herein with reference to specific logic operations (e.g., AND, OR, EX-OR, etc.), it will be understood that any suitable logic operator may be used.

As described above, apparatuses and methods for synchronizing clock signals according to example embodiments of the present invention may provide ore accurate control and/or consume less power. Apparatuses according to example embodiments of the present invention may synchronize the strobe clock signal and the data clock signal regardless of the change in a semiconductor manufacturing process and/or board (e.g., printed circuit board (PCB) or flexible PCB) pattern.

While example embodiments of the present invention have been particularly shown and described with reference to example embodiments illustrated in the figures, it will be understood by those skilled in the art that various changes in form and details may be made therein without departing from the spirit and scope of the present invention as defined by the appended claims.

What is claimed is:

1. An apparatus comprising:
a first phase control circuit for generating a first plurality of clock signals having different phases based on a received first input clock signal, selecting one of the first plurality of clock signals to output as a first clock signal, and comparing a phase of the first clock signal with a phase of a second clock signal, the one of the first plurality of clock signals being selected based on a result of the comparison; and
a second phase control circuit for controlling the phase of the second clock signal based on the result of the comparison; wherein
the first phase control circuit selects the one of the first plurality of clock signals and the second phase control circuit controls the phase of the second clock signal such that the phase of the first clock signal and the phase of the second clock signal are synchronized with each other.

2. An apparatus comprising:
a first phase control circuit for comparing a phase of a first clock signal with a phase of a second clock signal, and controlling the phase of the first clock signal based on a result of the comparison; and
a second phase control circuit for controlling the phase of the second clock signal based on the result of the comparison; wherein
the first phase control circuit controls the phase of the first clock signal and the second phase control circuit controls the phase of the second clock signal such that the phase of the first clock signal and the phase of the second clock signal are synchronized with each other, and
the first phase control circuit includes,
a first clock signal generation circuit generating a first plurality of clock signals having different phases based on a received first input clock signal,
a first selection circuit for receiving the first plurality of clock signals output from the first clock signal generation circuit, and outputting the one of the first plurality of clock signals as the first clock signal based on a selection signal corresponding to the result of the comparison,
a phase comparison circuit for receiving the first and second clock signals and comparing the phase of the first clock signal and the phase of the second clock signal, and
a selection signal generation circuit for generating the selection signal to synchronize the phase of the first clock signal and the phase of the second clock signal based on an output signal of the phase comparison circuit.

3. The apparatus as claimed in claim 2, wherein the second phase control circuit includes,
a second clock signal generation circuit for generating a second plurality of clock signals having different phases based on a received second input clock signal, and
a second selection circuit for receiving the second plurality of clock signals output from the second clock signal generation circuit and outputting one of the second plurality of clock signals as the second clock signal based on the selection signal.

4. An apparatus comprising:
a first phase control circuit for comparing a phase of a first clock signal with a phase of a second clock signal, and controlling the phase of the first clock signal based on a result of the comparison; and
a second phase control circuit for controlling the phase of the second clock signal based on the result of the comparison; wherein
the first phase control circuit controls the phase of the first clock signal and the second phase control circuit controls the phase of the second clock signal such that the phase of the first clock signal and the phase of the second clock signal are synchronized with each other, and the first phase control circuit includes,
a first clock signal generation circuit generating a first plurality of clock signals having different phases based on a received first input clock signal,
a first selection circuit for receiving the first plurality of clock signals output from the first clock signal generation circuit, and outputting one of the first plurality of clock signals as the first clock signal based on a selection signal corresponding to the result of the comparison, a sampling circuit which receives the first and second clock signals and samples the first clock signal based on the second clock signal, and a selection signal generation circuit which generates the selection signal based on an output signal from the sampling circuit.

5. An apparatus comprising:

a first phase control circuit for comparing a phase of a first clock signal with a phase of a second clock signal, and controlling the phase of the first clock signal based on a result of the comparison; and a second phase control circuit for controlling the phase of the second clock signal based on the result of the comparison; wherein the first phase control circuit controls the phase of the first clock signal and the second phase control circuit controls the phase of the second clock signal such that the phase of the first clock signal and the phase of the second clock signal are synchronized with each other, and the second phase control circuit includes, a second clock signal generation circuit for generating a second plurality of clock signals having different phases based on a received second input clock signal, and a second selection circuit for receiving the second plurality of clock signals output from the second clock signal generation circuit and outputting one of the second plurality of clock signals as the second clock signal based on a selection signal corresponding to the result of the comparison.

6. An apparatus comprising:

a first phase control circuit for comparing a phase of a first clock signal with a phase of a second clock signal, and controlling the phase of the first clock signal based on a result of the comparison; and a second phase control circuit for controlling the phase of the second clock signal based on the result of the comparison; wherein the first phase control circuit controls the phase of the first clock signal and the second phase control circuit controls the phase of the second clock signal such that the phase of the first clock signal and the phase of the second clock signal are synchronized with each other, and the first phase control circuit includes, a first clock signal generation circuit for generating a first plurality of clock signals having different phases based on a received first input clock signal, a first selection circuit for receiving the first plurality of clock signals output from the first clock signal generation circuit and outputting the one of the first plurality of clock signals as the first clock signal based on a selection signal corresponding to the result of the comparison, a phase comparison circuit for comparing the phase of the first clock signal and the phase of the second clock signal, a storage circuit for storing an output signal of the phase comparison circuit, and a selection signal generation circuit for outputting the selection signal based on an output signal output from the storage circuit.

7. The apparatus as claimed in claim 6, wherein the second phase control circuit includes, a second clock signal generation circuit for generating a second plurality of clock signals having different phases based on a received second input clock signal, and a second selection circuit for receiving the second plurality of clock signals output from the second clock signal generation circuit and outputting one of the second plurality of clock signals as the second clock signal based on the selection signal.

8. The apparatus as claimed in claim 6, wherein the storage circuit includes, a counter for outputting a count value in response to the second clock signal, a plurality of storage circuits each storing the output signal of the phase comparison circuit in response to the second clock signal and a corresponding count value output from the counter, a first logic circuit for performing a first logic operation on signals received from the storage circuits and outputting the results of the first logic operations, and a second logic circuit for performing a second logic operation on signals received from the storage circuits and outputting the results of the second logic operations.

9. An apparatus comprising:

a first phase control circuit for generating a first plurality of clock signals having different phases based on a received first input clock signal, selecting one of the first plurality of clock signals to output as a first clock signal, and sampling a second clock signal based on a first clock signal, the one of the first plurality of clock signals being selected based on a result of the sampling; and a second phase control circuit for controlling the phase of the second clock signal based on the second clock signal and the result of the sampling output from the first phase control circuit; wherein the first phase control circuit selects one of the plurality of clock signals and the second phase control circuit controls the phase of the second clock signal such that the phase of the first clock signal and the phase of the second clock signal are synchronized with each other.

10. An apparatus comprising:

a first phase control circuit for sampling a first clock signal based on a second clock signal, and controlling the phase of the first clock signal based on a result of the sampling; and a second phase control circuit for controlling the phase of the second clock signal based on the second clock signal and the result of the sampling output from the first phase control circuit; wherein the first phase control circuit controls the phase of the first clock signal and the second phase control circuit controls the phase of the second clock signal until the phase of the first clock signal and the phase of the second clock signal are synchronized with each other, and the first phase control circuit includes, a first clock signal generation circuit generating a first plurality of clock signals having different phases based on a received first input clock signal, a first selection circuit for receiving the first plurality of clock signals output from the first clock signal generation circuit, and outputting the one of the first plurality of clock signals as the first clock signal based on a selection signal corresponding to the result of the comparison, a sampling circuit for sampling the first clock signal based on the second clock signal, and a selection signal generation circuit for generating the selection signal based on an output signal from the sampling circuit.

11. An apparatus comprising:

a first phase control circuit for sampling a first clock signal based on a second clock signal, and controlling the phase of the first clock signal based on a result of the sampling; and a second phase control circuit for controlling the phase of the second clock signal based on the second clock signal and the result of the sampling output from the first phase control circuit; wherein the first phase control circuit controls the phase of the first clock signal and the second phase control circuit controls the phase of the second clock signal until the phase of the first clock signal and the phase of the second clock signal are synchronized with each other, and the first phase control circuit includes,
a first clock signal generation circuit for generating a first plurality of clock signals having different phases based on a received first input clock signal,
a first selection circuit for receiving the first plurality of clock signals output from the first clock signal generation circuit and outputting the one of the first plurality of clock signals as the first clock signal based on a selection signal corresponding to the result of the comparison,
a sampling circuit for sampling the first clock signal based on the second clock signal,
a storage circuit for storing an output signal of the sampling circuit, and
a selection signal generation circuit for outputting the selection signal based on an output signal output from the storage circuit.

12. An apparatus comprising:

a first phase control circuit for sampling a first clock signal based on a second clock signal, and controlling the phase of the first clock signal based on a result of the sampling; and a second phase control circuit for controlling the phase of the second clock signal based on the second clock signal and the result of the sampling output from the first phase control circuit; wherein the first phase control circuit controls the phase of the first clock signal and the second phase control circuit controls the phase of the second clock signal until the phase of the first clock signal and the phase of the second clock signal are synchronized with each other, and the second phase control circuit includes,
a second clock signal generation circuit for generating a second plurality of clock signals having different phases based on a received second input clock signal, and
a second selection circuit for receiving the second plurality of clock signals output from the second clock signal generation circuit and outputting one of the second plurality of clock signals as the second clock signal based on the selection signal.

13. A method for synchronizing clock signals in a digital system, the method comprising:

generating a first plurality of clock signals having different phases based on a received first input clock signal;

selecting one of the first plurality of clock signals to output as a first clock signal;

sampling the first clock signal in response to a second clock signal;

controlling a phase of the first clock signal and a phase of the second clock signal based on a result of the sampling such that the phase of the first clock signal and the phase of the second clock signal are synchronized with each other; wherein the first clock signal is one of a data clock signal and a strobe clock signal and the second clock signal is the other of the data clock signal and the strobe clock signal.

14. An apparatus comprising:

a first phase control circuit for comparing a phase of a first clock signal with a phase of a second clock signal, synchronizing the phase of the first clock signal with the phase of the second clock signal by controlling the phase of the first clock signal based on a result of the comparison, and outputting a synchronized first clock signal; and a second phase control circuit for receiving the second clock signal, synchronizing the phase of the first clock signal with the phase of the second clock signal by controlling the phase of the second clock signal based on the result of the comparison performed by the first phase control circuit, and outputting a synchronized second clock signal, the second clock signal and the first clock signal having the same phase.

15. A method for synchronizing clock signals in a digital system, the method comprising:

generating a first plurality of clock signals having different phases based on a received first input clock signal;

selecting one of the first plurality of clock signals to output as a first clock signal;

comparing a phase of the first clock signal with a phase of a second clock signal; and controlling the phase of the first clock signal and the phase of the second clock signal based on a result of the comparison such the phase of the first clock signal and the phase of the second clock signal are synchronized with each other; wherein the phase of the first clock signal is controlled by selecting one of the first plurality of clock signals based on the result of the comparison, and outputting the selected one of the first plurality of clock signals as the first clock signal.

* * * * *